United States Patent
Lojek

(10) Patent No.: US 7,348,626 B2
(45) Date of Patent: Mar. 25, 2008

(54) METHOD OF MAKING NONVOLATILE TRANSISTOR PAIRS WITH SHARED CONTROL GATE

(75) Inventor: Bohumil Lojek, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 7 days.

(21) Appl. No.: 11/120,937

(22) Filed: May 3, 2005

(65) Prior Publication Data
US 2005/0194632 A1 Sep. 8, 2005

Related U.S. Application Data

(62) Division of application No. 10/656,071, filed on Sep. 4, 2003, now Pat. No. 6,905,926.

(51) Int. Cl.
*H01L 29/788* (2006.01)
(52) U.S. Cl. ...................... 257/316; 257/315
(58) Field of Classification Search ............... 257/315, 257/316
See application file for complete search history.

(56) References Cited

U.S. PATENT DOCUMENTS

| | | | |
|---|---|---|---|
| 5,352,618 A | 10/1994 | Larsen et al. | 437/43 |
| 5,516,713 A | 5/1996 | Hsue et al. | 437/43 |
| 5,761,121 A | 6/1998 | Chang | 365/185.14 |
| 5,972,752 A | 10/1999 | Hong | 438/264 |
| 6,159,807 A | 12/2000 | Bryant et al. | 438/289 |
| 6,174,771 B1 | 1/2001 | Leu | 438/257 |
| 6,369,422 B1 | 4/2002 | Lojek | 257/321 |
| 6,486,031 B1 | 11/2002 | Lojek | 438/264 |
| 6,624,027 B1 | 9/2003 | Daemen et al. | 438/264 |
| 6,657,252 B2 * | 12/2003 | Fried et al. | 257/316 |
| 6,905,926 B2 | 6/2005 | Lojek | 438/257 |
| 2003/0060010 A1 * | 3/2003 | Yeh et al. | 438/257 |
| 2004/0079988 A1 * | 4/2004 | Harari | 257/316 |

* cited by examiner

*Primary Examiner*—Kiesha L. Rose
(74) *Attorney, Agent, or Firm*—Schneck & Schneck; Thomas Schneck

(57) ABSTRACT

A pair of nonvolatile memory transistors are carved from a single polysilicon floating gate on an insulated substrate. After surrounding the poly floating gate with insulator, the poly is etched except for two remnants remaining on lateral sides of the original floating gate. These remnants become a pair of new floating gates for the transistor pair. Prior to etching of the poly, the poly may be used for self-aligned placement of highly doped regions that serve as electrodes for the two transistors. If the single poly floating gate has a minimum feature size for a manufacturing process, the pair of poly remnants remaining after etching are even smaller, perhaps less than a fraction of the minimum feature size. With this small size, the devices will operate by band-to-band tunneling, i.e. without tunnel oxide, characteristic of larger EEPROM and EPROM devices. A single conductive control electrode over the poly remnants can allow both transistors to operate as independent storage devices if bit lines, connected to other electrodes, are phased.

18 Claims, 6 Drawing Sheets

METHOD OF MAKING NONVOLATILE TRANSISTOR PAIRS WITH SHARED CONTROL GATE

CROSS-REFERENCE TO RELATED APPLICATION

This is a divisional of U.S. patent application Ser. No. 10/656,071 filed Sep. 4, 2003, now U.S. Pat. No. 6,905,926, granted Jun. 14, 2005.

TECHNICAL FIELD

The invention relates to floating gate, nonvolatile, electrically alterable memory cells, and in particular to pairs of nonvolatile memory cells with dimensions smaller than the smallest line width that can be formed by semiconductor manufacturing lithography equipment.

BACKGROUND ART

Floating gate semiconductor nonvolatile memory cells, known as EEPROMS, for electrically erasable programmable read only memories, as well as EPROMs, for erasable programmable read only memories, were invented over 30 years ago. The devices allow charge storage on an electrically insulated, or floating, gate. The floating gate is not connected to any electrode, but is surrounded by dielectric material. Charge transfer occurs, in one type of operation, as programming voltages on other electrodes cause hot electrons or holes to penetrate surrounding insulation and become trapped on the gate. The logic state of the memory cell is determined by the presence or absence of charge on the floating gate which stores the charge until it is erased.

In U.S. Pat. No. 5,516,713, Hsue et al. teach a method of making EEPROM memory cells. A layer of silicon dioxide is grown over the surface of a semiconductor substrate. A layer of silicon nitride is deposited over the silicon dioxide layer and patterned. Silicon nitride spacers are formed on the sidewalls of the patterned silicon nitride layer. The silicon dioxide layer not covered by the patterned silicon nitride layer and the silicon nitride spacers is removed thereby exposing portions of the semiconductor substrate as tunneling windows. The silicon nitride layer and spacers are removed. A first polysilicon layer is deposited over the surface of the silicon dioxide and tunnel oxide layers and patterned to form a floating gate. An interpoly dielectric layer is deposited over the patterned first polysilicon layer followed by a second polysilicon layer which is patterned to form a control gate. Passivation and metallization complete the fabrication of the NAND-type memory cell with improved coupling ratio.

One of the problems encountered in making devices even smaller is the limit of line widths, or feature widths, imposed by photolithography or beam lithography for any manufacturing process. In fact, every semiconductor manufacturing process has its own minimum feature size defined by its lithography equipment or processes. Over the years, the smallest line widths have become smaller and smaller, today being less than 100 nanometers. Yet it is possible to make transistors even smaller by means of clever processing, making features smaller than characteristic lithographic minimum feature sizes.

In U.S. Pat. No. 6,369,422, granted Apr. 9, 2002, to B. Lojek and assigned to the assignee of the present invention, there is disclosed a method of making a nonvolatile memory cell structure wherein the size of the thin oxide window remains finite, but the part of the oxide window through which charge is transferred may be reduced to a size smaller than the minimum feature size resolution of the lithography equipment being used. This is accomplished by positioning the fixed-size oxide window in such a manner that its size is limited and whose position controls the amount of charge allowed to be transferred through it. The oxide window is constructed such that a first part of it lays over only one part of the two opposing field oxide regions and its remaining part lies over the channel region of a MOS transistor, but does not extend across it. This effectively creates a slit and the size of the slit may be adjusted by moving the position of the oxide window. Parts of the oxide window constructed over the field oxide region cannot be used to allow charge transfer to the floating gate. Only the part of the oxide window that lies over the channel region may be used to permit such charge transfer. Thus, one can construct an effective charge transfer region that is quite small, i.e. smaller than the minimum feature size of lithography equipment. While small transistor size is possible with this construction, the small window becomes an area of concern because the tunneling oxide window must be protected from process steps that might erode oxide quality.

In U.S. patent application Ser. No. 10/143,225, filed May 9, 2002, now U.S. Pat. No. 6,624,027 granted Sep. 23, 2003, to E. Daemen, B. Lojek and A. Renninger and assigned to the assignee of the present invention, there is disclosed a nonvolatile transistor memory construction featuring a thin window having a length or width which is less than the minimum feature size of the fabrication process using lithography. A nitride mask over a gate oxide layer on a substrate is used to first create self-aligned source and drain regions for an EEPROM memory cell. The nitride mask protects the future channel which will exist between source and drain electrodes. After formation of source and drain, a second nitride layer is deposited in which nitride spacers are formed on either side of the nitride mask and etched to a desired dimension having a length whose length will be the dimension of the tunnel oxide. Gate oxide is removed on one side of the nitride mask so that the dummy spacer on this side can approach the substrate. This dummy spacer has no purpose except to define the length of the future tunnel oxide window. The size of the spacer is smaller than that which could be made by lithography, typically a fraction of one micron. A supplemental oxide deposition on the sides of the nitride forms an oxide nest with the nitride spacers within, in a sort of slot. When nitride is removed by an etching process, the nest is empty. The ability to etch a narrow nest or slot establishes the small dimension of the thin window to be formed in this space, rather than a reliance on photographic resolution in photolithography. Once the nitride spacer is removed, a layer of thin tunnel oxide is applied across the edge of the cell. Where two cells are simultaneously formed in symmetric relation, the thin oxide can extend past the edge of the cell, across the edge of an adjacent cell and into a region formerly occupied by a dummy spacer in the adjacent cell. Such a thin oxide stripe, extending across two cells, does not interfere with the formation of the remainder of the two cells. For example, poly-one is deposited across each cell and etched back to form a floating gate. Real nitride spacers may optionally be formed at edges of the poly one floating gate. Subsequent layers of oxide and poly-two complete the cell structure. It should be noted that the real nitride spacers are not in the same position as the former dummy spacers, which have been lost to etching. The optional real spacers remain in place, protecting edges of the poly-one floating gate from lateral mobile electron or ion migration into or out of the floating gate. Select transistors may be formed simultaneously with EEPROM structures using selected layers and steps, such as the implantation step for source and drain formation, an oxide deposition step following nitride removal. This oxide deposition forms a gate oxide for the select transistor but forms an inter-poly oxide for the EEPROM devices. The oxide deposition is followed by poly-two layer deposition. The select and EEPROM transistors are now finished in the usual way.

An object of the invention is to devise a compact construction for nonvolatile dual bit memory cell transistors without thin oxide tunneling layers.

SUMMARY OF THE INVENTION

A method of making laterally symmetric pairs of floating gate memory transistors with floating gates smaller than a minimum feature size, where the "minimum feature size" is a minimum dimension, such as line width, that can be made in a particular manufacturing process using lithography.

Thus, "minimum feature size" is to be understood as a relative term and not as an absolute descriptor of a dimension. A minimum feature size floating gate poly member is constructed using lithography on a planar insulated semiconductor substrate, laterally surrounded by more insulative material so that the sides and bottom of the poly member are insulated. The floating gate is used for self-aligned placement of two highly doped regions in the substrate on opposite lateral sides of the floating gate poly member to be used as subsurface electrodes. The minimum feature size floating gate poly member is then etched away except for two laterally symmetric poly remnants adjacent to the insulative material. These remnants are now spaced apart by less than the minimum feature size and themselves are substantially smaller than the minimum feature size. By substantially smaller is meant that a dimension of each remnant, corresponding geometrically to the minimum feature size, is less than 25% smaller, and preferably less than 10% smaller, than the minimum feature size. For example, if the minimum feature size is a line width of dimension "x", a remnant would have a width substantially less than "x", perhaps 0.09x. The poly remnants are further insulated to prevent loss of charge and then a control gate is disposed over the poly remnants. No tunnel oxide has been provided. The result is a pair of laterally symmetric floating gate memory transistors with sufficiently small dimensions for band-to-band tunneling to be operative in combination with the subsurface electrodes.

DESCRIPTION

Figure 1:
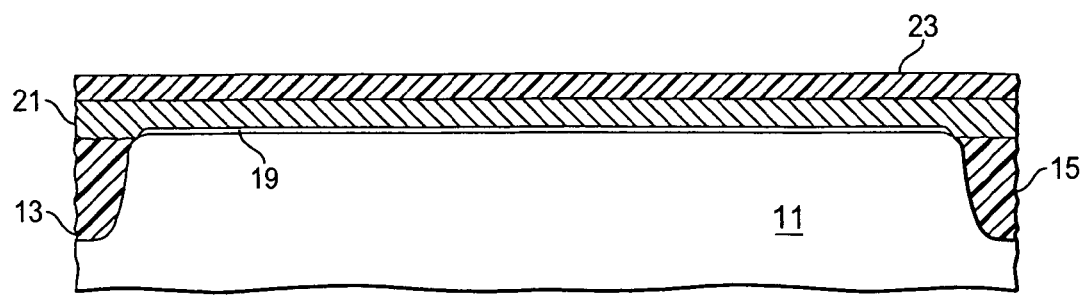
FIGS. 1 and 2 are side views of a silicon wafer with various surface layers even there.

With reference to FIG. 1, a doped semiconductor substrate 11 of either conductivity type, such as a silicon wafer, is partitioned into chip areas, with isolation zones 13 and 15 defining an active area for chip fabrication within the isolation zones. Isolation may be achieved with any of several well-known methods, preferably by shallow trench isolation (STI). The isolation zones form a peripheral boundary for a chip, isolating the chip from outside cross talk and noise that would be transmitted through the substrate. So, although the isolation zones appear to be lateral boundaries in the drawing, they are really circumferential, i.e. a closed region of some type where a chip may be built in electrical isolation, usually in the smallest amount of space possible.

After depositing approximately 70 Angstoms of cell oxide, i.e. silicon oxide, a first layer of polysilicon ("poly") 21 is deposited over the cell oxide to a thickness of about 1000 Angstroms, covering the entire active area. Over the poly layer, a layer of nitride 23 is grown, covering the poly layer 21. For example the nitride can be silicon nitride. The thickness of the nitride layer is about 1000-1500 Angstroms.

Figure 2:
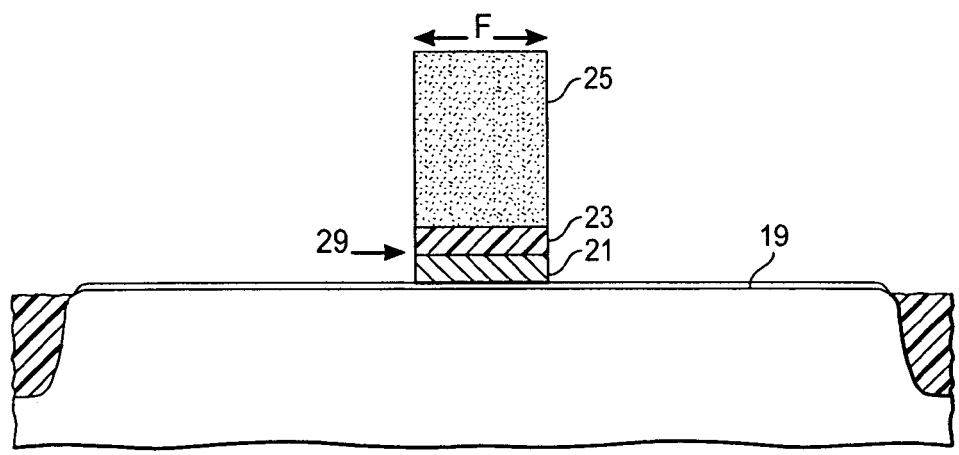

Next a photomask is applied over the combined layers as seen in FIG. 2, as part of a lithography procedure to etch a mesa 29. The mesa 29 has a layered construction, with the layers being as described above, namely cell oxide layer 19 above the substrate, then poly layer 21 over the cell oxide, and then nitride layer 23 over the poly layer. The mesa 29 contains a floating poly island that has a rectangular cross sectional dimension, F, the minimum feature size that can be defined by a particular manufacturing method. Apart from the mask 25, all nitride has been removed by etching. Similarly, apart from the mask 25, all polysilicon has been removed down to the oxide layer 19.

Figure 3:
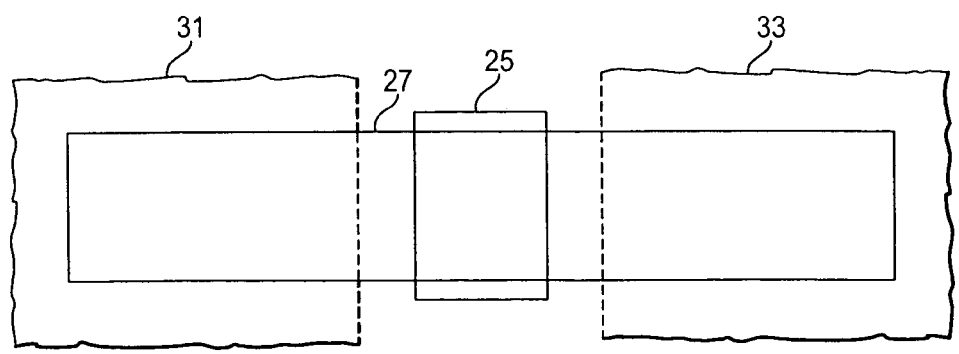
FIG. 3 is a top plan view of the device of FIG. 1.

In the top view of FIG. 3, mask 25 is seen to be astride the active region defined by rectangle 27. Two further masks, 31 and 33, are astride the active region. These are masks designed to block N+ ion implants in the regions where the masks are present, but to allow ion implantation where the masks are absent, resulting in highly doped substrate regions.

Figure 4:
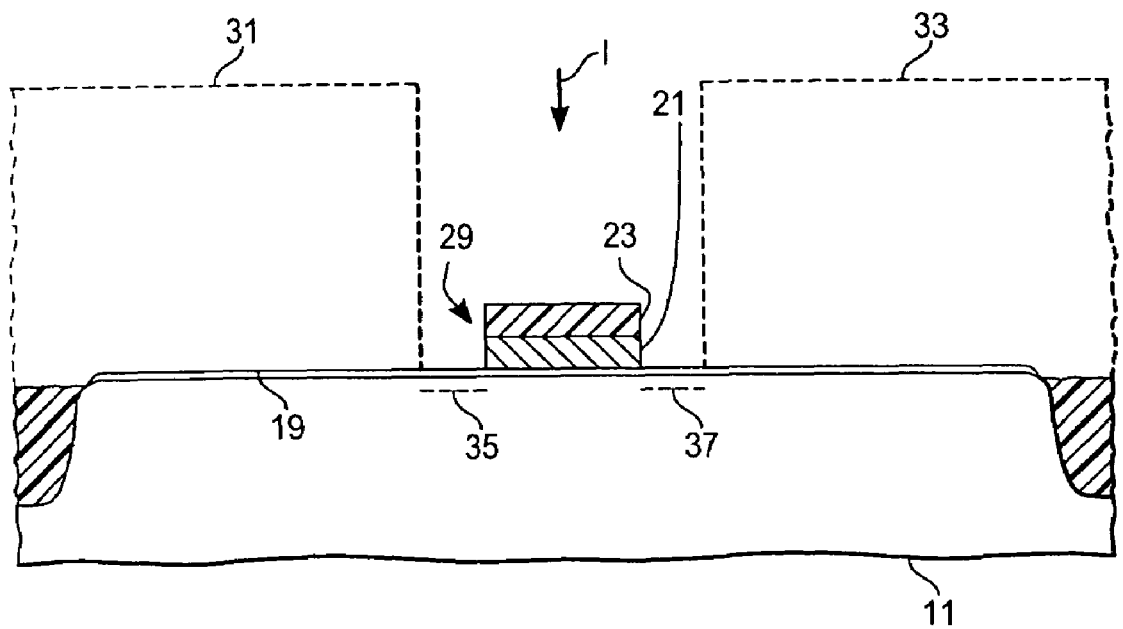
FIGS. 4-7 are side views of the device of FIG. 1 in later stages of manufacturing.

In FIG. 4, the non-relevant photomask 25 is shown to be removed, but may in fact be present during ion implantation, indicated by the arrow, I. Implanting may be with arsenic ions with a dose of 2 to $3 \times 10^{14}$ cm$^{-3}$ at 70 KeV into an N-substrate creating the highly doped regions 35 and 37 that will become the source and drain of a memory cell transistor. After implantation, the masks 31 and 33 are stripped down to the cell oxide 19 surface.

Figure 5:
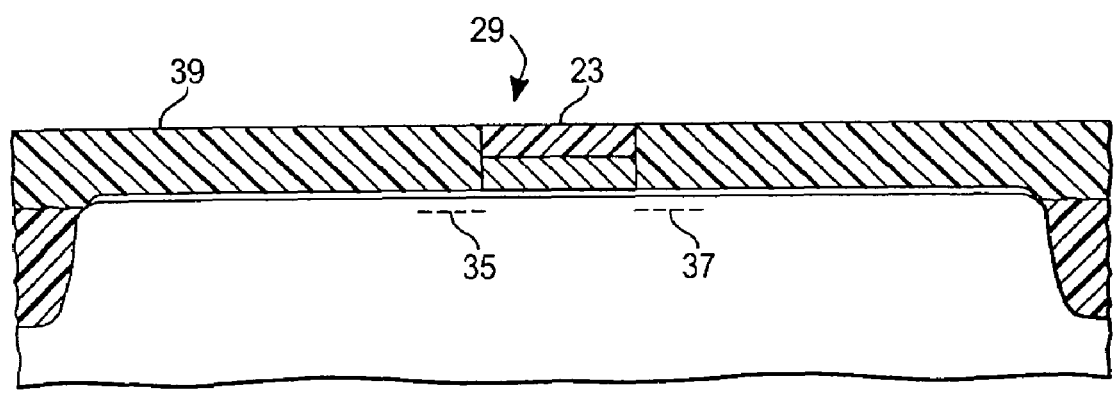
Figure 6:
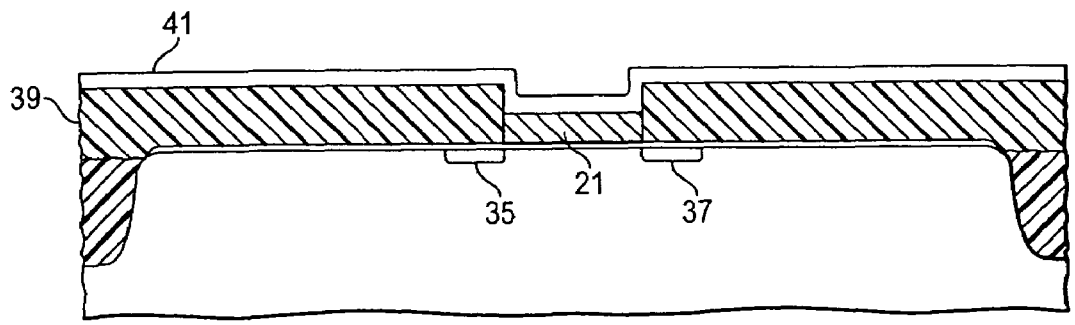
Figure 7:
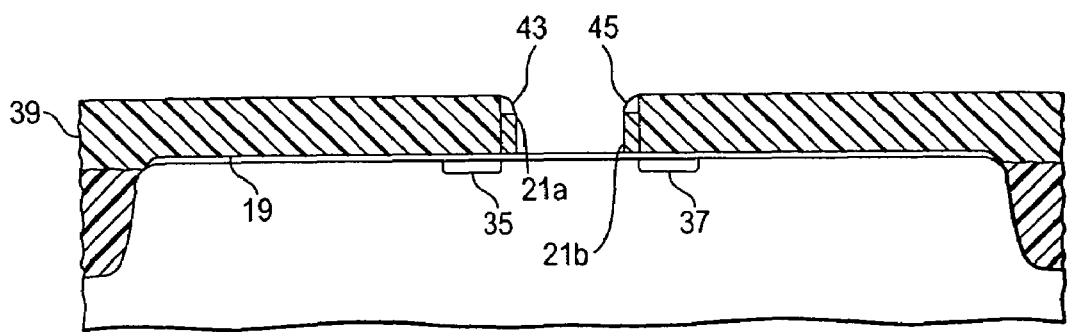

In FIG. 5, an oxide layer 39 has been deposited by chemical vapor deposition over cell oxide layer 19 to surround mesa 29 to a uniform height. The wafer may be planarized by CMP polishing. Next, the small nitride tip 23 is removed by wet etching and a new nitride layer 41, seen in FIG. 6, is deposited over the oxide layer 39 and the poly island 21. Heating during nitride deposition, and at other times, drives the highly doped regions 35, 37 further into the substrate forming respective source and drain regions. Next, the nitride is etched, but not thoroughly. Nitride from horizontal surfaces is removed, but a slight amount of nitride extending vertically from one nitride level to another remains, forming nitride spacers. Poly island 21 is also etched away with a dry poly etch, stopping at the oxide layer, leaving poly remnants 21a and 21b, seen in FIG. 7, under nitride spacers 43 and 45.

Figure 8:
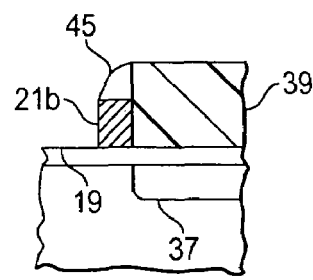
FIG. 8 is an enlarged side view of a detail in FIG. 7.
Figure 9:
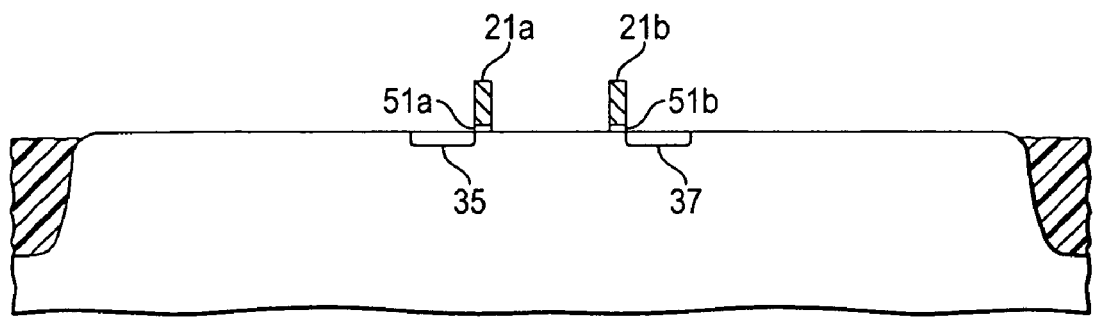
FIGS. 9-12 are side views of the device of FIGS. 4-7 in still later stages of manufacturing.
Figure 10:
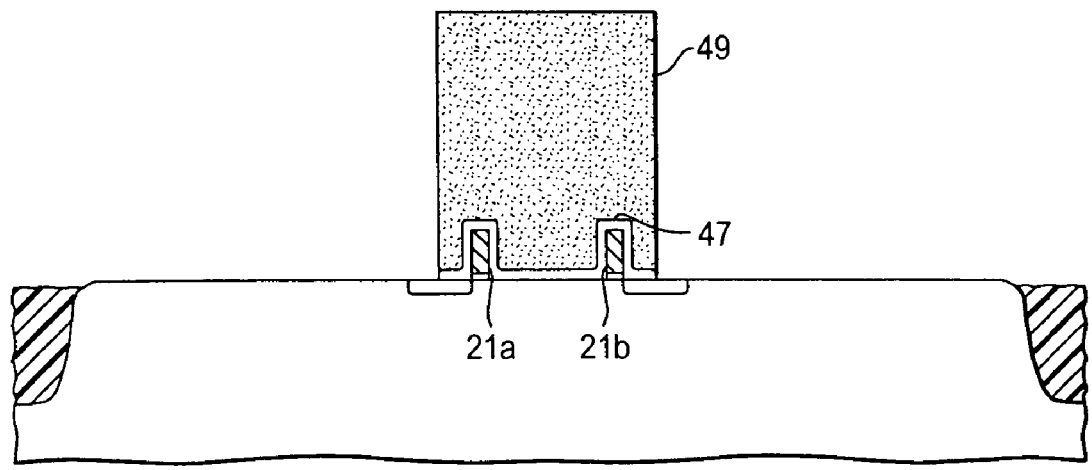

FIG. 8 shows an enlarged view of nitride spacer 45 atop poly remnant 21b, with highly doped region 37, either a source or drain, nearby. Next, a wet etch removes oxide layer 39, as well as exposed cell oxide 19 stopping at the substrate, as seen in FIG. 9. The only remaining members above the semiconductor surface are the poly remnants 21a and 21b above small cell oxide remnants 51a and 51b adjacent to subsurface electrodes 35 and 37. Next an oxide-nitride-oxide (ONO) layer 47, seen in FIG. 10, is grown over the poly remnants 21a and 21b. Next, a protective mask 49 is grown over the ONO layer 47. A thin gate oxide layer, not shown in FIG. 10, is grown to about the same thickness as ONO layer 47, except adjacent to lateral edges of the ONO layer.

Figure 11:
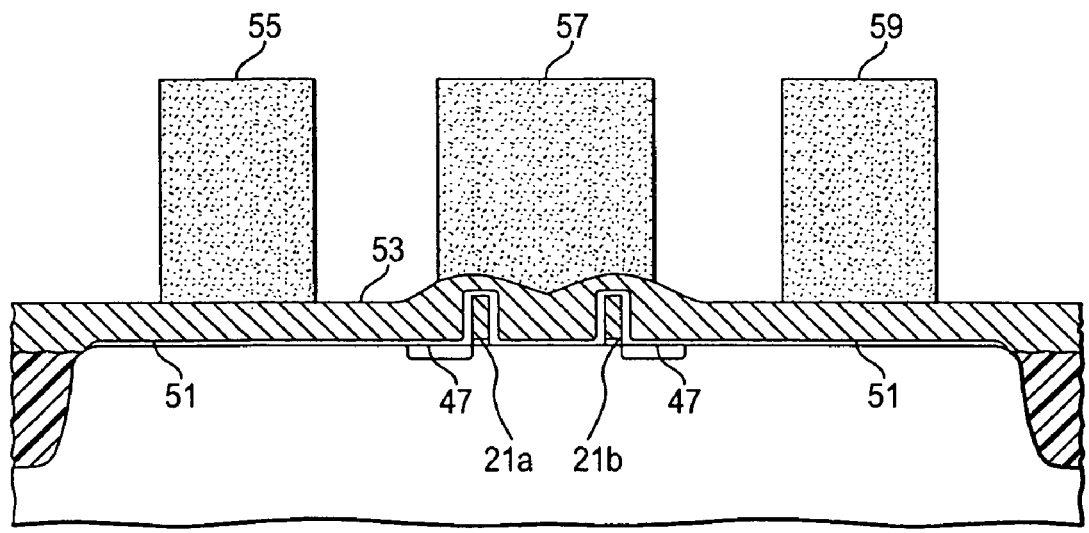
Figure 12:
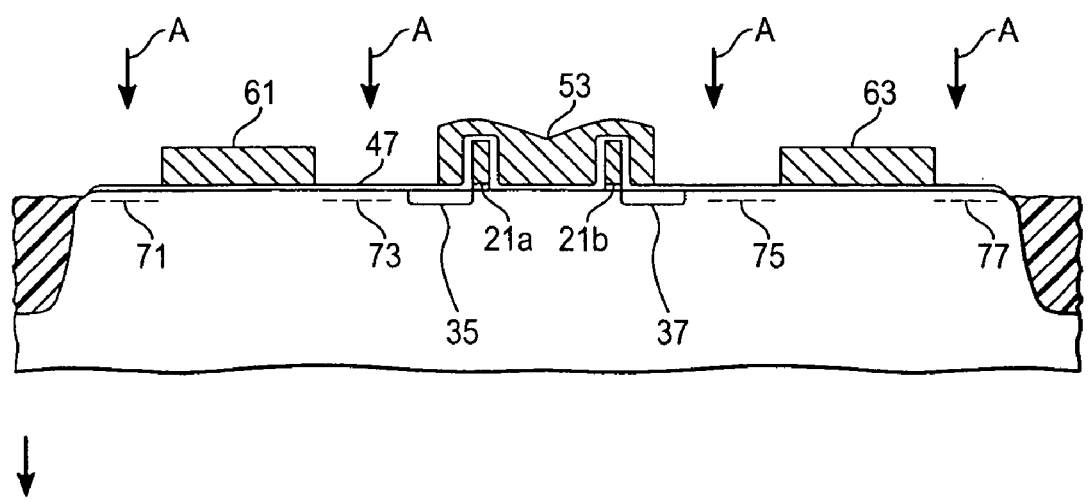

In FIG. 11 gate oxide layer 51 may be seen to resemble extensions of ONO layer 47 laterally outwardly of the polysilicon abutments 21a and 21b. Once the gate oxide layer is deposited the protective mask 49 is removed. Next a layer of polysilicon is deposited known as the control polysilicon layer 53. This layer extends over the gate oxide layer 51, as well as the ONO layer 47. Next, masks 55, 57 and 59 are placed over the control poly layer 53. These masks should attenuate ions used in ion implantation from reaching the control poly. Prior to ion implantation, the control poly not under the masks 55, 57 and 59 is etched, leaving the polysilicon pattern seen in FIG. 12 with select gates 61 and 63 and only a portion of control poly layer 53 covering both of the poly remnants 21a and 21b. Spaces between the masks are subject to ion implantation, in locations shown by arrows, A, in FIG. 12. After ion implantation, the masks are removed leaving uncovered select gates 61 and 63. Poly remnants 21a and 21b remain covered by control poly portion 53, becoming two floating gates in a dual bit storage device. Meanwhile, ion implantation has created the highly doped subsurface regions that will become electrodes for select transistors after being thermally driven into the substrate. The transistors are now finished in the usual way with one or more protective layers and contacts formed during typical passivation and metalization steps. The size of the poly remnants 21a and 21b is very small, but adequate for storing charge as the remnants function as a pair of floating gates of two memory cells controlled by a single control poly layer 53.

Figure 13:
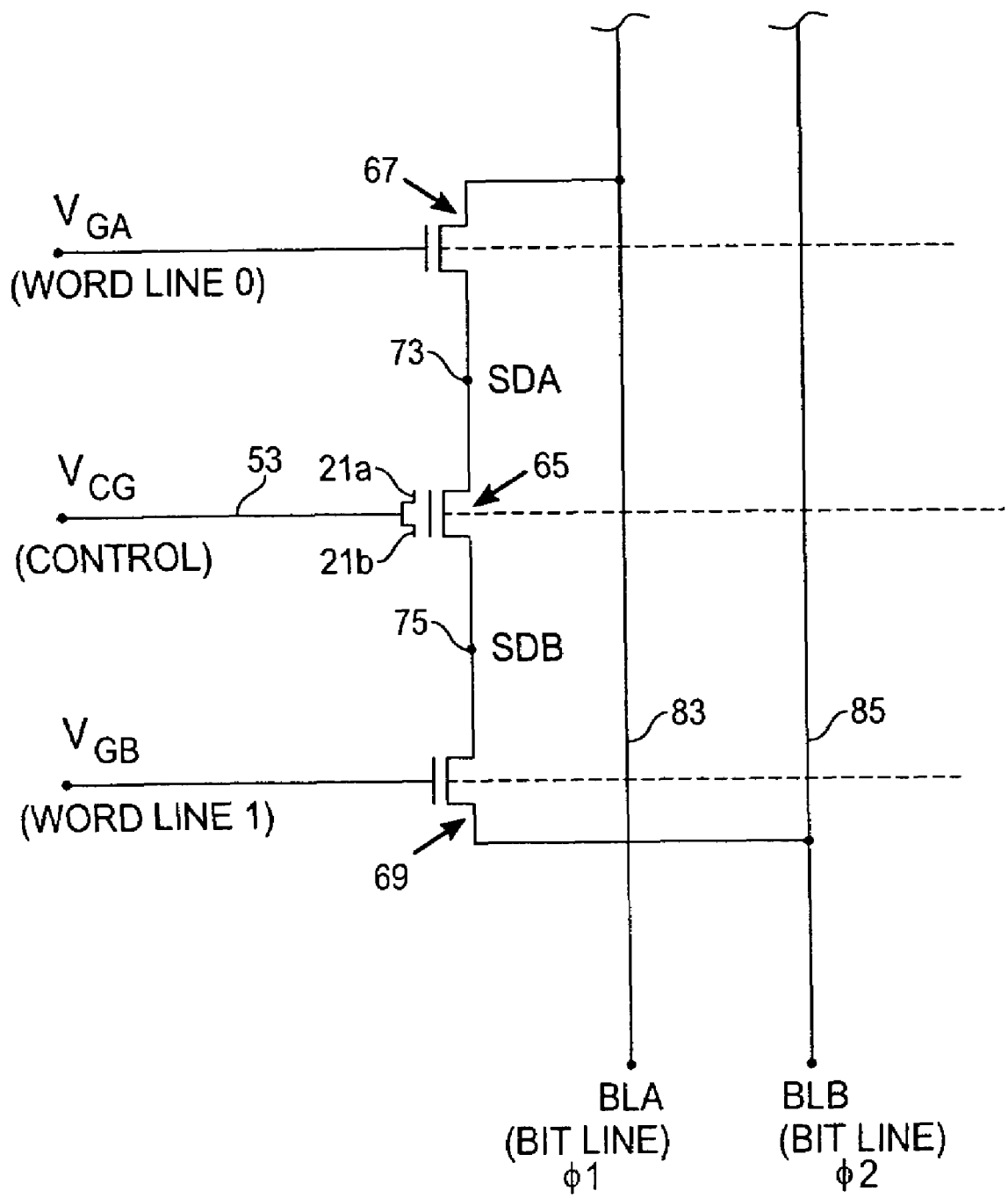
FIG. 13 is a circuit diagram relating to the apparatus of FIG. 1.

An equivalent circuit is seen in FIG. 13 where two floating gates 21a and 21b are connected to a single control gate 53 for the dual bit memory transistor 81. Select transistors 67 and 69 share common electrodes 73 and 75, labeled SDA and SDB, with dual bit memory transistor 81. Voltages on these nodes can bias junctions to induce band-to-band tunneling relative to the floating gates. Charge accumulations trapped on the floating gate indicate a memory state. The bit lines are used to sense the state of charge of the two floating gates in the dual bit memory transistors 81. Band-to-band tunneling occurs partly because of the small dimensions of the cell and an appropriate concentration of dopants in the highly doped regions 35 and 37, and to a lesser extent, regions 73 and 75.

With the floating gate polysilicon remnants 21a and 21b being tiny amounts of silicon, channel lengths are exceedingly small such that electrons or holes in the source or drain become sufficiently energetic to cause electrons to be pulled from the floating gate.

In operation, relatively low voltages may be used to program the memory transistor. The bit lines 83 and 85 are not held at the same voltage for program and erase, but are phase alternates relative to ground. Phase alternating of the bit lines allows the two floating gates, acting like two devices A and B, with a common control gate, to share the same source and drain. Examples of voltages are as follows:

Program Device A $V_{CG}$      +6V $V_{GA}$      $+V_G$ $\Big\} SDA \approx +4V$
BLA      +4V

SUBSTRATE GND $V_{GB}$      $+V_G$ $\Big\} SDB \approx GND$
BLB      GND

Program Device B $V_{CG}$      +6V $V_{GA}$      $+V_G$ $\Big\} SDA \approx GND$
BLA      GND

SUBSTRATE GND $V_{GB} = +V_G$ $BLB = +4V$

Erase $V_{GA} = V_{GB} = +V_G$

SUBSTRATE = GRD $V_{CG} = -5 \div -6V$ $BLA + BLB = 4V$

The invention claimed is:

1. A pair of non-volatile memory transistors comprising, a pair of floating gates disposed over an insulated substrate, the floating gates spaced apart by a distance less than a minimum feature size of a chip manufacturing process,
a pair of highly doped source and drain regions in the substrate laterally outward of the pair of floating gates in band-to-band tunneling relation with the pair of floating gates, and
a single conductive control gate spaced in insulated relation over the pair of floating gates, the control gate electrically communicating with the substrate, the floating gates and the highly doped regions to make two independent memory transistors.

2. The apparatus of claim 1 wherein each floating gate has a dimension less than 25% of the minimum feature size.

3. The apparatus of claim 2 wherein each floating gate has a dimension less than 10% of the minimum feature size.

4. The apparatus of claim 3 wherein each floating gate has a dimension equal to 0.09 times the minimum feature size.

5. A non-volatile dual bit memory cell comprising,
an active semiconductor substrate area defined by isolation regions, the substrate covered by an insulating layer over the substrate,
a pair of floating gate non-volatile memory transistors having floating gates over the insulating layer and spaced apart by a distance less than a minimum feature size of a chip manufacturing process, the transistors within the active area with the floating gates having source and drain regions in the substrate laterally outward of the floating gates with a single control gate in insulated relation covering the pair of floating gates, a pair of select transistors within the active area, each select transistor having a subsurface electrode that is shared with the non-volatile memory transistors.

6. The memory cell of claim 5 wherein each select transistor has a subsurface electrode that is not shared with the non-volatile memory transistor, the non-shared electrode being a bit line.

7. The memory cell of claim 5 wherein each select transistor is associated with a different word line.

8. The memory cell of claim 6 further defined by each bit line being associated with voltage means for applying phase alternate voltages to the bit lines.

9. The memory cell of claim 5 wherein each floating gate has a dimension less than 25% of the minimum feature size.

10. The memory cell of claim 9 wherein each floating gate has a dimension less than 10% of the minimum feature size.

11. The memory cell of claim 10 wherein each floating gate has a dimension equal to 0.09 times the minimum feature size.

12. A pair of non-volatile memory transistors comprising, a pair of floating gates disposed over an insulated substrate, the floating gates both constructed in at least one dimension within a minimum feature size of a chip manufacturing process, a pair of highly doped source and drain regions in the substrate laterally outward of the pair of floating gates in band-to-band tunneling relation with the pair of floating gates, and a single conductive control gate spaced in insulated relation over the pair of floating gates, the control gate electrically communicating with the substrate, the floating gates and the highly doped regions to make two independent memory transistors.

13. The memory transistors of claim 12 each having an associated electrically connected select transistor with a first electrode in the substrate shared with one of the source and drain highly doped regions and a second electrode in the substrate operating as a bit line.

14. The memory transistors of claim 13 wherein each select transistor is associated with a word line.

15. The memory transistors of claim 14 defined by each bit line being associated with voltage means for applying phase alternate voltages to the bit lines.

16. The memory transistors of claim 12 wherein each floating gate has a dimension less than 25% of the minimum feature size.

17. The memory transistors of claim 16 wherein each floating gate has a dimension less than 10% of the minimum feature size.

18. The memory transistors of claim 17 wherein each floating gate has a dimension equal to 0.09 times the minimum feature size.

* * * * *

UNITED STATES PATENT AND TRADEMARK OFFICE
CERTIFICATE OF CORRECTION

PATENT NO. : 7,348,626 B2
APPLICATION NO. : 11/120937
DATED : March 25, 2008
INVENTOR(S) : Lojek Page 1 of 1

It is certified that error appears in the above-identified patent and that said Letters Patent is hereby corrected as shown below:

On the title page, item (54), line 1, before "NONVOLATILE" delete "METHOD OF MAKING".

In column 1, line 1, before "NONVOLATILE" delete "METHOD OF MAKING".

In column 4, line 12, delete "Angstoms" and insert -- Angstroms --, therefor.

In column 8, line 17, in Claim 15, after "claim 14" insert -- further --.

Signed and Sealed this

Seventh Day of October, 2008

JON W. DUDAS
*Director of the United States Patent and Trademark Office*